United States Patent
Ko et al.

(10) Patent No.: US 9,336,957 B2
(45) Date of Patent: May 10, 2016

(54) METHOD OF PREPARING COUNTER ELECTRODE FOR DYE-SENSITIZED SOLAR CELL

(71) Applicant: KOREA INSTITUTE OF SCIENCE AND TECHNOLOGY, Seoul (KR)

(72) Inventors: Min-Jae Ko, Seoul (KR); Tae-Yeon Kang, Gwacheon-si (KR); Kyung-Kon Kim, Seoul (KR); Doh-Kwon Lee, Seoul (KR); Hong-Gon Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 14/527,506

(22) Filed: Oct. 29, 2014

(65) Prior Publication Data

US 2015/0083216 A1    Mar. 26, 2015

Related U.S. Application Data

(62) Division of application No. 13/032,727, filed on Feb. 23, 2011, now abandoned.

(30) Foreign Application Priority Data

Oct. 22, 2010 (KR) ........................ 10-2010-0103387

(51) Int. Cl.
*H01L 51/48* (2006.01)
*H01G 9/20* (2006.01)
(Continued)

(52) U.S. Cl.
CPC ........... *H01G 9/2022* (2013.01); *H01G 9/2095* (2013.01); *H01L 51/0021* (2013.01); *H01L 51/0027* (2013.01); *H01M 14/00* (2013.01); *Y02E 10/542* (2013.01); *Y02E 10/549* (2013.01)

(58) Field of Classification Search
CPC ........... H01L 51/0021; H01L 51/0027; H01G 9/2022; H01G 9/2095
USPC ........................................................ 136/263
See application file for complete search history.

(56) References Cited

U.S. PATENT DOCUMENTS

| 2005/0072458 A1* | 4/2005 | Goldstein ............ H01G 9/2031 136/251 |
| 2008/0072960 A1* | 3/2008 | Kim ....................... B82Y 30/00 136/263 |

(Continued)

FOREIGN PATENT DOCUMENTS

| JP | 2005-310722 A | 11/2005 |
| JP | 2006-331790 A | 12/2006 |

(Continued)

OTHER PUBLICATIONS

Kang, Tae Yeon et al., "A Facile and Rapid Process to Fabricate Platinum Counter Electrode in Dye-Sensitized Solar Cell Using Nanosecond Pulsed Laser Sintering at Room Temperature." Journal of nanoscience and nanotechnology 14.7 (2014): 5309-5312.

(Continued)

*Primary Examiner* — Jayne Mershon
(74) *Attorney, Agent, or Firm* — NSIP Law

(57) ABSTRACT

The following description relates to a method of low temperature sintering a catalyst layer that formed on one side of a counter electrode using a laser. It is possible to prepare a counter electrode for a dye-sensitized solar cell (DSSC) based on a flexible substrate easily because the method can be applied to a conducting substrate made of plastic materials as well as a conducting glass substrate.

7 Claims, 3 Drawing Sheets

(51) Int. Cl.
*H01L 51/00* (2006.01)
*H01M 14/00* (2006.01)

(56) References Cited

U.S. PATENT DOCUMENTS

| | | |
|---|---|---|
| 2008/0202585 A1 | 8/2008 | Yamanaka et al. |
| 2009/0165855 A1 | 7/2009 | Sun et al. |
| 2009/0235986 A1 | 9/2009 | Hotz et al. |
| 2011/0220205 A1* | 9/2011 | Jang ............... H01G 9/2031 136/263 |
| 2011/0240112 A1* | 10/2011 | Ahn ............... H01G 9/2095 136/256 |

FOREIGN PATENT DOCUMENTS

| | | | |
|---|---|---|---|
| KR | 10-2008-0006735 A | | 1/2008 |
| KR | WO 2012/024644 | * | 3/2010 |
| KR | 10-2010-0074032 A | | 7/2010 |

OTHER PUBLICATIONS

Non Final Office Action issued Dec. 31, 2014 in parent U.S. Appl. No. 13/032,727.

* cited by examiner

METHOD OF PREPARING COUNTER ELECTRODE FOR DYE-SENSITIZED SOLAR CELL

CROSS-REFERENCE TO RELATED APPLICATION

This application is a Divisional application of U.S. application Ser. No. 13/032,727, filed Feb. 23, 2011, which claims the benefit under 35 U.S.C. §119(a) of Korean Patent Application No. 10-2010-0103387 filed on Oct. 22, 2010, in the Korean Intellectual Property Office (KIPO), the entire disclosures of which are incorporated herein by reference for all purposes.

BACKGROUND (a) Field

The following description relates to a method of preparing a counter electrode for a dye-sensitized solar cell (DSSC) using a laser, and more particularly, to a low temperature sintering method of a catalyst layer of the counter electrode using a laser for preparing a counter electrode of a flexible DSSC.

(b) Background

In the DSSCs, the counter electrode may reduce redox species which were used as the media for recycling dyes after an electron injection. The counter electrode should have a sheet resistance as small as possible and a high reduction reaction speed to the redox electrolytes. For this, platinized transparent counter electrodes and counter electrodes including carbons, conductive polymers, and the like, have largely been used. The electrodes including polymer/carbon or polymer/platinum together are largely being used as the counter electrodes of the flexible DSSC. Particularly, a platinum-loaded conductive glass substrate is most widely used as the counter electrode of the DSSC.

Thermal sintering is the method that is most widely used for sintering platinum which is used as a catalyst for a redox reaction of electrolytes. For example, chloroplatinic acid ($H_2PtCl_6$), a platinum precursor, may be dissolved in a volatile solvent such as propanol and coated on a glass substrate by a spin-coating or dropping method, wherein the glass substrate is coated with a fluorine-doped tin oxide (FTO), and the substrate is sintered by heat-treating the same at 400° C. for approximately 20 minutes.

However, the thermal sintering has a disadvantage of being time-consuming. Furthermore, when a plastic substrate is used for the counter electrode, the thermal sintering method cannot be carried out because the plastic substrate is damaged at the high temperature. Therefore, in the case of flexible DSSC, counter electrodes have been prepared by a sputtering method or an electrochemical method that deposits platinum on a plastic substrate of ITO-PEN or conductive polymer at room temperature. Such methods have an advantage of decreasing the damage of the plastics used as the electrode substrate by using a low temperature process. However, these methods have a disadvantage of requiring many processes.

SUMMARY

In one general aspect, there is provided a counter electrode comprising a conductive substrate, and a catalyst layer formed on one side of the substrate, and the catalyst layer is sintered with a laser.

The conductive substrate may be selected from the group consisting of a conductive glass substrate, a conductive polymer substrate, a plastic substrate including conductive materials, a metal substrate, and a plastic substrate including carbon compounds.

The conductive glass substrate may be a glass substrate in which a transparent conductive materials or a conductive material is added.

The plastic substrate may include at least one selected from the group consisting of poly(ethylene terephthalate) (PET), poly(ethylene naphthalate) (PEN), polycarbonate (PC), polypropylene (PP), polyimide (PI), triacetyl cellulose (TAC), polyethersulfone, cyclo olefin copolymer (COC), polyarylite, a material including an organically modified silicate, a copolymer thereof, and a mixture thereof.

The catalyst layer may be formed from a platinum precursor solution including at least one selected from the group consisting of $H_2PtCl_6$, $H_2PtCl_4$, and $[Pt(NH_3)_4]Cl_2$, or a solution further including carbon compounds in said platinum precursor solution.

The carbon material may be at least one selected from the group consisting of an activated carbon, a graphite, a carbon nano-tube, a carbon black, a grapheme, and a mixture thereof.

The catalyst layer may be formed by a method of spin-coating, spray-coating, or dropping.

The laser may be a pulsed laser or a continuous laser.

The laser may generate a beam having the wavelengths corresponding to UV-Visible absorption band of the catalyst layer.

The sintering may be carried out by transferring the counter electrode horizontally after fixing the incident angle of the laser, or by using a laser scanner after fixing the counter electrode.

Other features and aspects will be apparent from the following detailed description, the drawings, and the claims.

Figure 1:
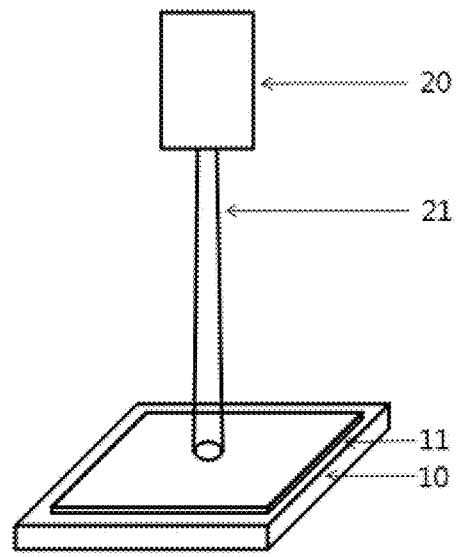
FIG. 1 is a diagram illustrating an example of preparing a counter electrode.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Described herein is a counter electrode for a dye-sensitized solar cell (DSSC). The counter electrode may include a conductive substrate, a catalyst layer formed on one side of the substrate, and a catalyst material used in the catalyst layer is sintered by using a laser.

The present invention also provides a method of preparing a counter electrode for a DSSC, wherein the conductive substrate is selected from a conductive glass substrate, a conductive polymer substrate, a plastic substrate including conductive materials, or a metal substrate.

In certain aspects, the catalyst layer may be formed from a platinum precursor solution including a platinum precursor selected from $H_2PtCl_6$, $H_2PtCl_4$, and $[Pt(NH_3)_4]Cl_2$, or a solution further including carbon compounds in said platinum precursor solution.

In certain aspects, the catalyst layer may be prepared using a laser capable of generating a beam having the wavelengths corresponding to UV-Visible absorption band of the platinum precursor solution.

The sintering time for platinum may be shortened by using a laser for sintering platinum in the catalyst layer of the counter electrode, compared with prior thermal sintering methods, in the case of glass substrate. When a plastic substrate is used, the laser may sinter the catalyst layer without thermal damage of the plastic substrate. In addition, the counter electrode may be used for a DSSC, and completed the present invention.

In certain aspects, the counter electrode includes a conductive substrate, a catalyst layer formed on one side of the substrate, and a catalyst material used in the catalyst layer is sintered by using a laser.

The method of preparing the counter electrode is described with reference to FIG. 1.

At First, the method of preparing the counter electrode according to one embodiment passes the step of preparing a transparent substrate 10 for the counter electrode. The substrate 10 may be selected from conventional substrates in the related art. For example, the substrate may be selected from a conductive glass substrate, a conductive polymer substrate, a plastic substrate including conductive materials, a metal substrate, and a plastic substrate including carbon compounds.

For example, the conductive glass substrate may be a substrate doped with a transparent conducting oxide (TCO) such as FTO and ITO, or a conductive material such as zinc, titanium, and antimony.

The plastic substrate including conductive materials, such as ITO-PEN substrate, may use at least one material from the group consisting of poly(ethylene terephthalate) (PET), poly(ethylene naphthalate) (PEN), polycarbonate (PC), polypropylene (PP), polyimide (PI), triacetyl cellulose (TAC), polyethersulfone, cyclo olefin copolymer (COC), polyarylite, a material including an organically modified silicate, a copolymer thereof, and a mixture thereof, however, it is not limited thereto.

The metal substrate may be a titanium or stainless steel substrate, however, it is not limited thereto.

In the glass or plastic substrate including carbon compounds, the carbon compounds may be at least one selected from the group consisting of an activated carbon, a graphite, a carbon nano-tube, a carbon black, a grapheme, and a mixture thereof.

Subsequently, a catalyst layer 11 for an activation of redox reaction of electrolytes may be formed on one side of the conductive substrate 10 of the counter electrode. For example, the catalyst layer 11 may be formed by spin-coating, spray-coating, or dropping a coating solution including a platinum precursor commonly used in the DSSC, or a coating solution further including carbon compounds in the platinum precursor solution. For example, the platinum precursor may be $H_2PtCl_6$, $H_2PtCl_4$, or $[Pt(NH_3)_4]Cl_2$. The platinum precursor solution may be a solution in which chloroplatinic acid ($H_2PtCl_6$) is dissolved in 2-propanol, however, it is not limited to this. The concentration of the solution may be in the range of 3.5~14 mM, for example, the concentration may be 7 mM for the conversion efficiency and the fill factor of the counter electrode.

Furthermore, it is possible to include carbon compounds in the platinum precursor solution. For example, the carbon compounds may be at least one selected from the group consisting of an activated carbon, a graphite, a carbon nanotube, a carbon black, a grapheme, and a mixture thereof, and preferably an activated carbon. For example, the activated carbon may be included in the coating solution with 0.5 wt % to 1.0 wt %.

Subsequently, the catalyst layer may be sintered using a laser. The laser may be a pulsed laser or a continuous laser. For sintering the catalyst layer the laser may be a laser capable of generating a beam having the wavelengths corresponding to UV-Visible absorption band of the platinum precursor solution. The laser may be capable of generating high enough power for sintering the catalyst without damaging the substrate to the area outside the absorption area of precursor solution. The sintering process may be carried out by transferring the counter electrode horizontally after fixing the incident angle of the laser, or by scanning the counter electrode with a laser scanner after fixing the electrode. The sintering time may depend on the kind of substrate, the kind of laser, the size of laser beam, and the like.

For example, for sintering the platinum precursor solution a pulsed laser of 355 nm wavelength of Nd:YAG laser device 20 may be used. When the pulsed laser of 355 nm wavelength is used for sintering the platinum catalyst layer on the conductive glass substrate, the laser may have a power of 40~60 mJ per pulse. Furthermore, when the platinum catalyst layer on the conductive plastic substrate is sintered, the laser may have a power of 10~20 mJ per pulse.

According to various aspects, it is possible to simplify prior processes carried out by sputtering or electrochemical deposition. The following method may also shorten the sintering time in comparison with prior high temperature sintering methods. In addition, the present preparation method may form the catalyst layer on one side of the counter electrode without thermal damage to the plastic substrate.

Hereinafter, a few examples are explained. However, the Examples are merely for purposes of example, and the following description is not limited to or by them.

Example 1

Preparation of a Counter Electrode Based on a Conductive Glass Substrate

A FTO glass substrate was prepared as a substrate 10 for the counter electrode. A catalyst layer 11 was formed on the FTO substrate by dropping a platinum precursor solution (7 mM) that chloroplatinic acid ($H_2PtCl_6$) was dissolved in 2-propanol. The platinum precursor solution of the catalyst layer was dried in the air. Thereafter, the catalyst layer was sintered with a laser 21 of 355 nm wavelength corresponding to UV-Visible absorption band of the platinum precursor solution. At this time, a pulsed Nd:YAG laser device 20 was used, and the laser power was 50 mJ per pulse. The sintering process was carried out by irradiating the whole area of the catalyst layer with the laser while transferring the counter electrode horizontally after fixing the incident angle of the laser. The sintering time was approximately 1 minute per a unit cell (15*20 mm).

Fabrication of a DSSC

The characteristics of the prepared counter electrode were identified by fabricating the DSSC with the counter electrode.

A common transparent conductive glass substrate (FTO) was used for a photoelectrode of a DSSC. Titanium oxide nanopaste (average diameter: 20 nm) was coated on the conductive glass substrate (FTO) by a doctor blade method, and then the substrate was heat-treated at 500° C. for 30 minutes. After this, the photoelectrode was prepared by immersing the substrate in an ethanol solution including a photosensitive dye (Ru(4,4'-dicarboxy-2,2'-bipyridine)$_2$(NCS)$_2$) of 0.5 mM for 12 hours so as to adsorb the dye on the substrate.

A common iodine-based electrolyte including PMII (1-methyl-3-propylimidazolium iodide, 0.7M) and I$_2$ (0.03M) was injected into the space between the prepared counter electrode and the photoelectrode, and sealed so as to prepare the DSSC.

Example 2

Preparation of a Counter Electrode Based on a Plastic Substrate Including Conductive Materials An ITO-PEN substrate which is a plastic substrate including conductive materials was prepared as the substrate 10 for the counter electrode. A catalyst layer 11 was formed by dropping the catalyst solution of Example 1 on the ITO-PEN substrate. The sintering process was carried out according to the same method as in Example 1. At this time, relatively low laser power of 15 mJ per pulse was used. The sintering time was 5 minutes per a unit cell (15*20 mm).

Fabrication of a DSSC

A DSSC was prepared according to the same method as in Example 1.

Example 3

Preparation of a Counter Electrode Based on a Conductive Glass Substrate

A DSSC was prepared according to the same method as in Example 1 except that a platinum precursor solution including 0.5 wt % of an activated carbon was used.

Example 4

Preparation of a Counter Electrode Based on a Conductive Glass Substrate

A DSSC was prepared according to the same method as in Example 1 except that a platinum precursor solution including 1.0 wt % of an activated carbon was used.

Experimental Example 1

The open circuit voltage, the photocurrent density, the energy conversion efficiency, and the fill factor were measured on the DSSC prepared in Example 1 according to the following methods, and the results are shown in the following Table 1 and FIG. 2.

(1) Open Circuit Voltage (V) and Photocurrent Density (mA/cm$^2$)

the open circuit voltage and the photocurrent density were measured using a Keithley SMU2400.

(2) Energy Conversion Efficiency (%) and Fill Factor (%)

the energy conversion efficiency was measured using a solar simulator of 1.5 AM 100 mW/cm$^2$ (consist of Xe lamp [1600 W, YAMASHITA DENSO], AM1.5 filter, and Keithley SMU2400), and the fill factor was calculated using the energy conversion efficiency and the following Calculation Formula.

$$\text{Fill Factor (\%)} = \frac{(J \times V)_{max}}{J_{SC} \times V_{OC}} \times 100 \quad \text{[Calculation Formula]}$$

In the Calculation Formula, J is the Y axis value of the conversion efficiency curve, V is the X axis value of the conversion efficiency curve, and $J_{sc}$ and $V_{oc}$ are respectively intercept values of each axis.

TABLE 1

| Classification | Open Circuit Voltage (V) | Photocurrent Density (mA/cm$^2$) | Fill Factor (%) | Conversion Efficiency (%) | Thickness of the Metal Oxide (μm) |
|---|---|---|---|---|---|
| Example 1 | 0.7423 | 10.511 | 61.63 | 4.81 | 8.0 |

Figure 2:
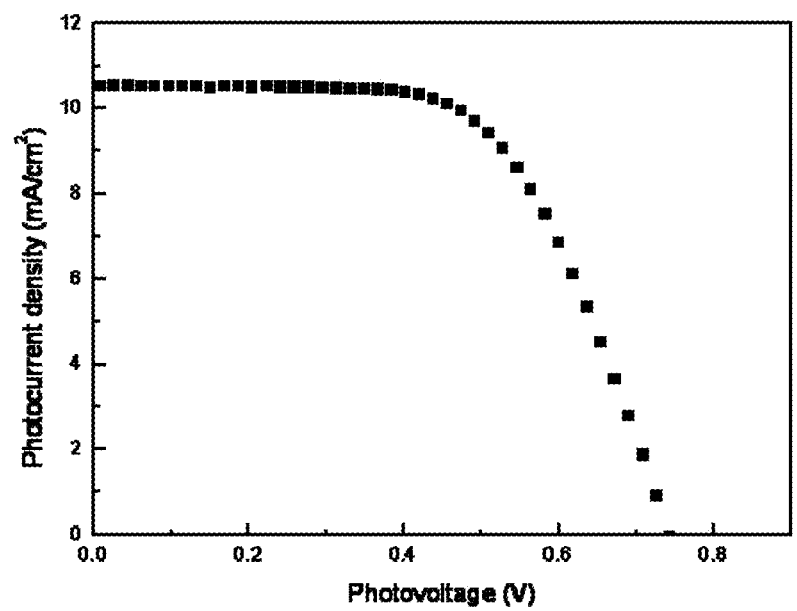
FIG. 2 is a graph illustrating the current-voltage curve of the DSSC according to Example 1 and Experimental Example 1 concerned with the sintering of platinum on the glass substrate, wherein the graph was obtained under A.M 1.5 condition.

According to Table 1 and FIG. 2, the counter electrode prepared in Example 1 shows the fill factor of 60% or more, and it can be recognized that the counter electrode can be used for the DSSC.

Experimental Example 2

Figure 3:
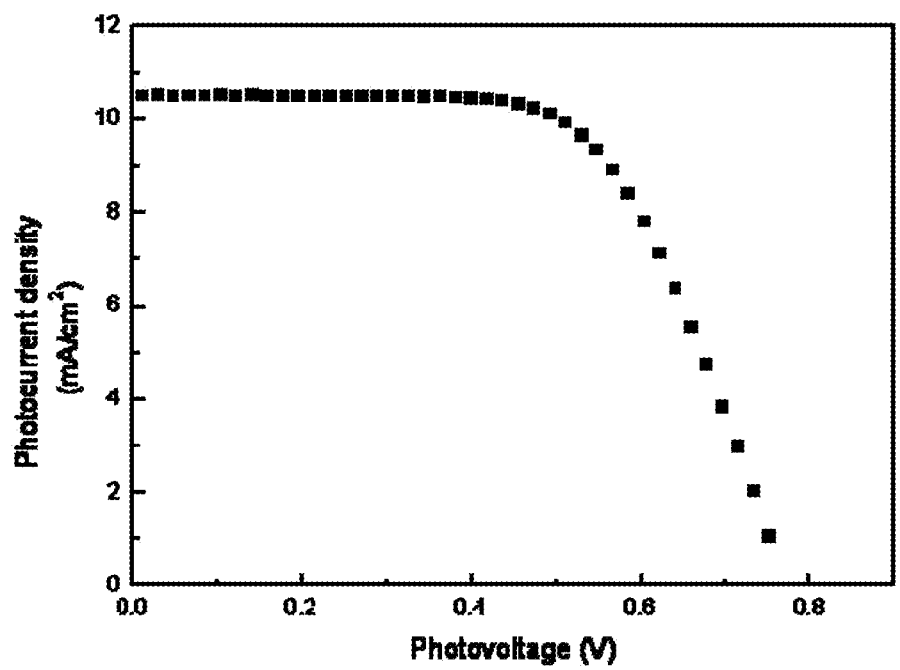
FIG. 3 is a graph illustrating the current-voltage curve of the DSSC according to Example 2 and Experimental Example 2 concerned with the sintering of platinum on the plastic substrate, wherein the graph was obtained under A.M 1.5 condition.

The open circuit voltage, the photocurrent density, the energy conversion efficiency, and the fill factor were measured on the DSSC prepared in Example 2 according to the same method as in Experimental Example 1, and the results of the photoelectric characteristics calculated from FIG. 3 are shown in the following Table 2.

TABLE 2

| Classification | Open Circuit Voltage (V) | Photocurrent Density (mA/cm$^2$) | Fill Factor (%) | Conversion Efficiency (%) | Thickness of the Metal Oxide (μm) |
|---|---|---|---|---|---|
| Example 2 | 0.7693 | 10.527 | 63.27 | 5.12 | 8.0 |

According to Table 2 and annexed FIG. 3, it can be recognized that the counter electrode based on the plastic substrate also can be used for the DSSC.

Experimental Example 3

Figure 4:
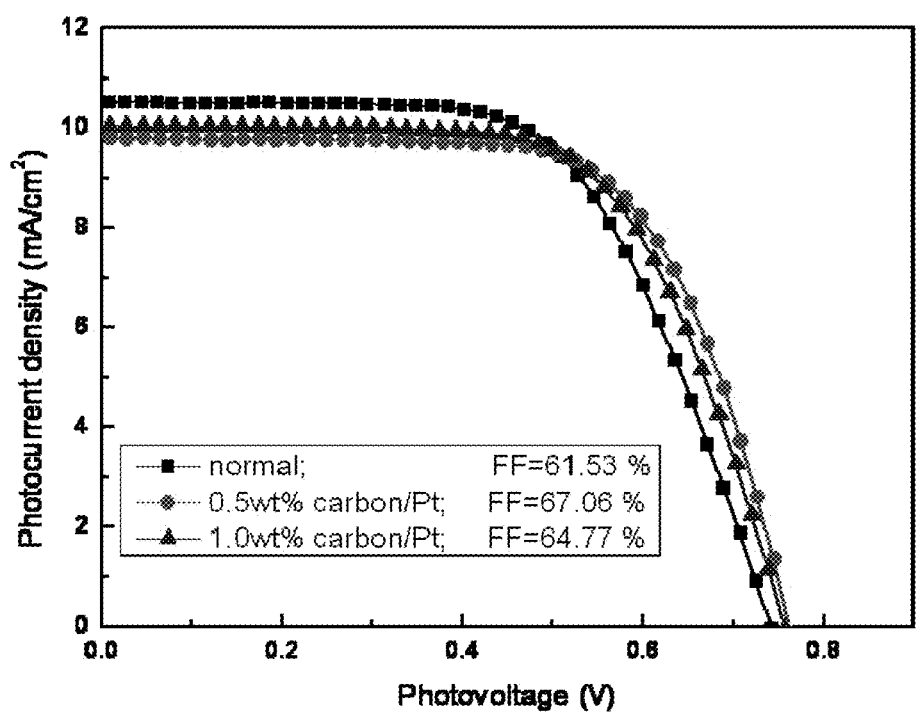
FIG. 4 is a graph illustrating the current-voltage curve of the DSSC according to Examples 3 and 4, and Experimental Example 3 concerned with the sintering of platinum on the glass substrate, wherein the graph was obtained under A.M 1.5 condition.

The open circuit voltage, the photocurrent density, the energy conversion efficiency, and the fill factor were measured on the DSSC prepared in Examples 3 and 4 according to the same method as in Experimental Example 1, and the results of the photoelectric characteristics calculated from FIG. 4 are shown in the following Table 3.

TABLE 3

| Classification | Content of Activated Carbon (wt %) | Open Circuit Voltage (V) | Photocurrent Density (mA/cm$^2$) | Fill Factor (%) | Conversion Efficiency (%) | Thickness of the Metal Oxide (μm) |
| --- | --- | --- | --- | --- | --- | --- |
| Example 1 | 0 | 0.7423 | 10.511 | 61.63 | 4.81 | 8.0 |
| Example 3 | 0.5 | 0.7624 | 9.800 | 67.06 | 5.01 | 8.0 |
| Example 4 | 1.0 | 0.7565 | 10.046 | 64.77 | 4.92 | 8.0 |

According to Table 3 and annexed FIG. 4, it can be recognized that the counter electrode prepared using the catalyst solution not only including the platinum precursor but also further including the activated carbon can be used for the DSSC.

As explained above, a person skilled in the art to which the present invention pertains can understand that numerous modifications and variations of the present invention are possible in light of the above teachings and the scope of the appended claims. Therefore, it must be understood that the Examples described above are provided only for understanding the present invention, and the present invention is not limited to or by them.

EXPLANATION OF REFERENCE NUMERALS

10: conductive substrate
11: catalyst layer
20: laser device
21: laser

What is claimed is:

1. A counter electrode comprising:
   a conductive substrate selected from the group consisting of a plastic substrate including conductive materials and a plastic substrate including carbon compounds; and
   a laser sintered catalyst layer formed on one side of the substrate.

2. The counter electrode of claim 1, wherein the plastic substrate includes at least one selected from the group consisting of poly(ethylene terephthalate) (PET), poly(ethylene naphthalate) (PEN), polycarbonate (PC), polypropylene (PP), polyimide (PI), triacetyl cellulose (TAC), polyethersulfone, cyclo olefin copolymer (COC), polyarylite, a material including an organically modified silicate, a copolymer thereof, and a mixture thereof.

3. The counter electrode of claim 1, wherein the catalyst layer is formed from a platinum precursor solution including at least one selected from the group consisting of $H_2PtCl_6$, $H_2PtCl_4$, and $[Pt(NH_3)_4]Cl_2$, or a solution further including carbon compounds in said platinum precursor solution.

4. The counter electrode of claim 3, wherein the carbon material is at least one selected from the group consisting of an activated carbon, a graphite, a carbon nano-tube, a carbon black, a graphene, and a mixture thereof.

5. The counter electrode of claim 1, wherein the laser is a pulsed laser or a continuous laser.

6. The counter electrode of claim 1, wherein the laser generates a beam having the wavelengths corresponding to UV-Visible absorption band of the catalyst layer.

7. The counter electrode of claim 1, wherein the sintering is carried out by transferring the counter electrode horizontally after fixing the incident angle of the laser, or by using a laser scanner after fixing the counter electrode.

* * * * *